United States Patent
Lee et al.

(10) Patent No.: US 9,106,128 B2
(45) Date of Patent: Aug. 11, 2015

(54) CHARGE PUMP CIRCUIT AND PHASE-LOCKED LOOP INCLUDING THE CHARGE PUMP CIRCUIT

(71) Applicant: Electronics and Telecommunications Research Institute, Daejeon (KR)

(72) Inventors: Hui Dong Lee, Daejeon (KR); Jae Ho Jung, Daejeon (KR); Kwangchun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/311,417

(22) Filed: Jun. 23, 2014

(65) Prior Publication Data

US 2015/0200589 A1   Jul. 16, 2015

(30) Foreign Application Priority Data

Jan. 13, 2014   (KR) .......................... 10-2014-0004105

(51) Int. Cl.
*H03L 7/06* (2006.01)
*H02M 3/07* (2006.01)
*H03L 7/089* (2006.01)

(52) U.S. Cl.
CPC .............. *H02M 3/07* (2013.01); *H03L 7/0896* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,118,346 A * | 9/2000 | Olgaard | 331/17 |
| 6,586,976 B2 | 7/2003 | Yang | |
| 7,339,438 B2 * | 3/2008 | Sohn | 331/17 |
| 7,471,157 B2 * | 12/2008 | Fan | 331/16 |
| 7,492,228 B2 * | 2/2009 | Strange | 331/16 |
| 7,719,328 B2 * | 5/2010 | Fu | 327/156 |
| 8,274,317 B2 | 9/2012 | Cho et al. | |
| 8,487,677 B1 * | 7/2013 | Xue | 327/157 |
| 2002/0097825 A1 * | 7/2002 | Kawahara | 375/376 |
| 2007/0132491 A1 * | 6/2007 | Kuo et al. | 327/157 |
| 2011/0063004 A1 * | 3/2011 | Chen et al. | 327/157 |
| 2013/0194012 A1 * | 8/2013 | Hsu | 327/157 |
| 2014/0292387 A1 * | 10/2014 | Dasgupta et al. | 327/157 |
| 2015/0116017 A1 * | 4/2015 | Fu | 327/157 |

FOREIGN PATENT DOCUMENTS

| | | |
|---|---|---|
| KR | 2002-0057767 A | 7/2002 |
| KR | 10-2009-0000449 A | 1/2009 |

\* cited by examiner

*Primary Examiner* — Adam Houston
(74) *Attorney, Agent, or Firm* — NSIP Law

(57) ABSTRACT

Provided is a charge pump circuit having a current mirror structure, including a first voltage controller including a plurality of first resistors and a plurality of first switches, and in response to a switching control signal corresponding to a bias current, driving the plurality of first switches to allow a current path passing through the plurality of first resistors to bypass, thereby controlling a voltage level of an output end, a second voltage controller including a plurality of second resistors and a plurality of second switches, and in response to the switching control signal, driving the plurality of second switches to allow a current path passing through the plurality of second resistors to bypass, thereby controlling a voltage level of an output end to correspond to the voltage of the output end of the first voltage controller.

12 Claims, 6 Drawing Sheets

CHARGE PUMP CIRCUIT AND PHASE-LOCKED LOOP INCLUDING THE CHARGE PUMP CIRCUIT

CROSS-REFERENCE TO RELATED APPLICATIONS

This U.S. non-provisional patent application claims priority under 35 U.S.C. §119 of Korean Patent Application No. 10-2014-0004105, filed on Jan. 13, 2014, the entire contents of which are hereby incorporated by reference.

BACKGROUND OF THE INVENTION

The present invention disclosed herein relates to a phase-locked loop, and more particularly, to a charge pump circuit improving current matching properties and a phase-locked loop including the charge pump circuit.

When a signal is shown as a frequency domain, the signal is divided into an amplitude component indicating intensity of the signal and a phase component indicating timing properties. The phase component of the signal is sensitive to a temperature or an effect of a peripheral circuit, a phase of the signal, that is, a frequency is easily changed. For example, in transmitting a digital signal, a clock signal is generated with a signal delay depending on a signal path. As the signal delay is generated, the phase of the signal is changed. Accordingly, since a beginning and an end of the clock signal become unclear, a circuit for synchronizing the beginning and the end of the clock signal is necessary.

A phase-locked loop (PLL) circuit is a frequency feedback circuit stably outputting a random frequency signal to be synchronized with a frequency of an external input signal. PLL circuits described above are generally used in analog and digital electronic circuit systems.

For example, PLL circuits are used to stably supply oscillating frequencies of local oscillation circuits in order to transmit and receive signals in wireless communication systems. Also, PPL circuits are used to generate reference clock signals necessary for processing digital signals in digital circuits such as microprocessors.

However, PPLs, depending on external environments, may vary in signal outputting properties. For example, according to external environments such as peripheral temperatures, power voltages, and process variations, outputting properties of PPLs vary. Particularly, PPLs vary in outputting properties with current matching properties of a charge pump (CP).

SUMMARY OF THE INVENTION

The present invention provides a charge pump circuit improving in current matching properties and a phase-locked loop (PPL) including the charge pump circuit.

Embodiments of the present invention provide charge pump circuits having a current mirror structure, including a first voltage controller including a plurality of first resistors and a plurality of first switches, and in response to a switching control signal corresponding to a bias current, driving the plurality of first switches to allow a current path passing through the plurality of first resistors to bypass, thereby controlling a voltage level of an output end, a second voltage controller including a plurality of second resistors and a plurality of second switches, and in response to the switching control signal, driving the plurality of second switches to allow a current path passing through the plurality of second resistors to bypass, thereby controlling a voltage level of an output end to correspond to the voltage of the output end of the first voltage controller, and an output unit charging or discharging an external capacitor with a voltage, based on the voltage level of the output end of the first voltage controller.

In other embodiments of the present invention, phase-locked loops (PPL) include a phase detector generating up and down signals based on differences in phase and frequency of a reference frequency and an oscillating frequency, a charge pump receiving a bias current and outputting up and down currents based on the bias current in response to the up and down signals, a loop filter generating a voltage in response to an output of the up and down currents, and a voltage control oscillator outputting the oscillating frequency in response to an output voltage of the loop filter. Herein, the charge pump includes a plurality of resistors and a plurality of switches, and in response to a switching control signal corresponding to the bias current, drives the plurality of switches to allow a current path passing through the plurality of resistors to bypass, thereby controlling a voltage level of an output end of the charge pump.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
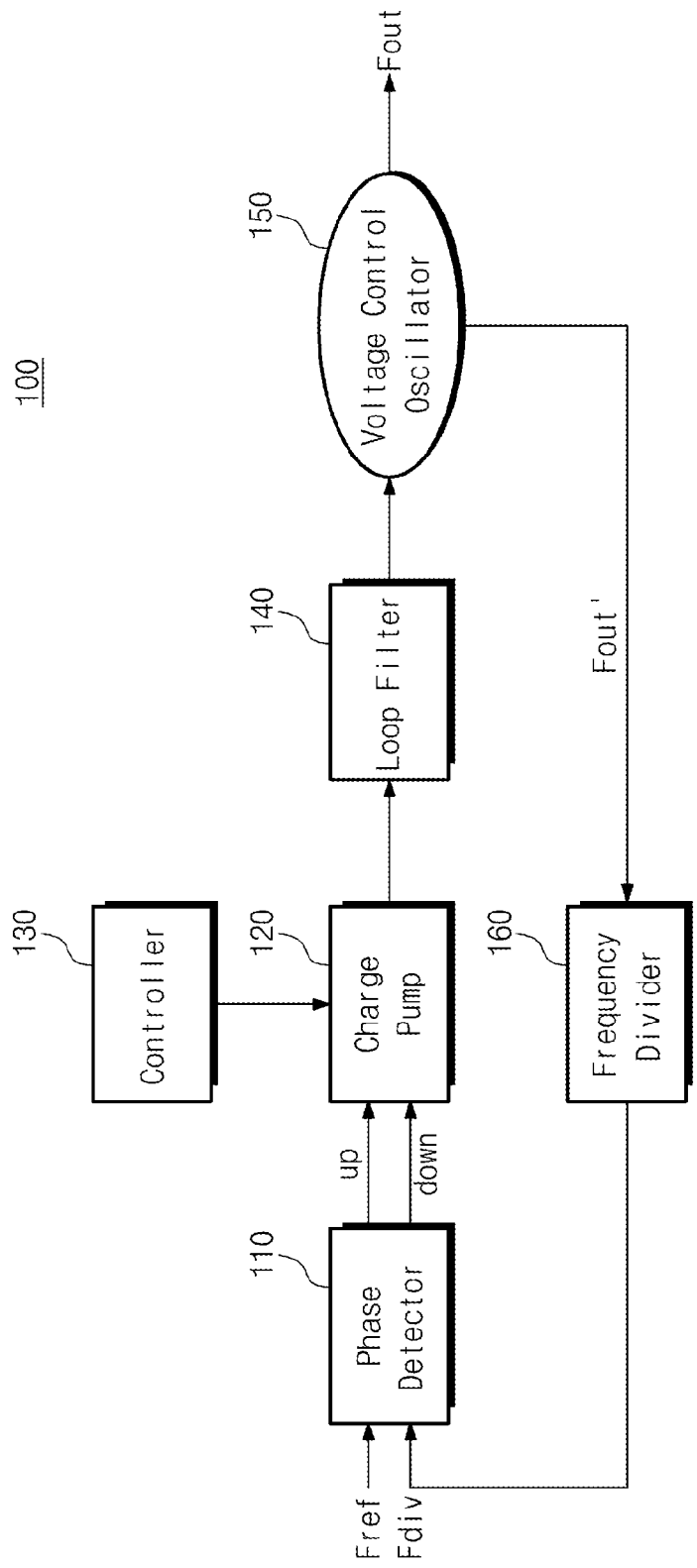
FIG. 1 is a block diagram illustrating a phase-locked loop (PPL) according to an embodiment of the present invention.

Hereinafter, in order to allow a person of ordinary skill in the art to easily execute technical thoughts of the present invention, embodiments of the present invention will be described in detail with reference to the attached drawings. Like reference numerals refer to like elements. Similar reference numerals refer to similar elements. The embodiments to be described below are just examples and may be variously changed and modified within a range of the technical thoughts of the present invention.

FIG. 1 is a block diagram illustrating a phase-locked loop (PPL) 100 according to an embodiment of the present invention. Referring to FIG. 1, the PPL 100 includes a phase detector 110, a charge pump 120, a controller 130, a loop filter 140, a voltage control oscillator 150, and a frequency divider 160.

The phase detector 110 receives a reference frequency Fref from the outside and receives an oscillating signal Fdiv with frequency divided by the frequency divider 160. For example, the reference frequency Fref may be provided from a crystal oscillator. The phase detector 110 detects differences in one of phases and frequencies of the reference frequency Fref and the oscillating signal Fdiv with divided frequency, respectively.

The phase detector 110, based on a difference in detected phase or frequency, generates up and down signals to be applied to the charge pump 120. The phase detector 110 is electrically connected to the charge pump and transmits the generated up and down signals to the charge pump 120.

The charge pump 120, in response to the up and down signals transmitted from the phase detector 110, generates charges or currents. In other words, the charge pump 120 may change a current level in order to uniformly maintain a loop bandwidth of the PPL 100 according to external environments. As the external environments, there may be present a peripheral temperature, a power supply voltage, and process variations.

For example, the charge pump 120, when a frequency of the oscillating signal Fdiv with frequency divided is higher than a frequency of the reference frequency signal Fref, may discharge currents as a sink. On the contrary, the charge pump 120, when the frequency of the oscillating signal Fdiv with frequency divided is lower than the frequency of the reference frequency signal Fref, may supply currents as a source.

The controller 130 generates a control signal controlling an operation of the charge pump 120. The controller 130 transmits the generated control signal to the charge pump 120. For example, the control signal may be a clock signal and may control overall operations of the charge pump 120.

The loop filter 140 includes a capacitor. The capacitor of the loop filter 140 is charged or discharged according to properties of a current outputted from the charge pump 120. The loop filter 140 generates a voltage according to a charge amount of charging or discharging of the capacitor. For example, when the current is discharged from the charge pump 120, the loop filter 140 generates a low voltage. On the contrary, when the current is supplied from the charge pump 120, the loop filter 140 generates a high voltage. In the embodiment, the loop filter 140 may be a low-pass filter for filtering out a high frequency component of a current signal outputted from the charge pump 120.

The voltage control oscillator 150 generates an oscillating signal Fout in response to an output voltage of the loop filter 140. The generated oscillating signal Fout may have a frequency corresponding to the output voltage of the loop filter 140. For example, when a gain of the voltage control oscillator 140 is great, the PPL 100 may output an oscillating signal having a broad frequency. Also, for example, the voltage control oscillator 150 may transmit the oscillating signal Fout' to the frequency divider 160 through a buffer.

The frequency divider 160 receives an oscillating signal Fout' outputted from the voltage control oscillator 150 and decreases a frequency of the received oscillating signal Fout' in a dividing ratio. The frequency divider 160 provides the phase detector 110 with an oscillating signal Fdiv with frequency decreased, that is, frequency divided.

As described above, the PPL 100 is a frequency feedback circuit stably outputting a frequency signal, that is, the oscillating signal Fout outwards. However, generally, depending on level properties of a current outputted from a charge pump, an oscillating signal Fout may be generated with noises. Accordingly, in order to uniformly maintain a loop bandwidth of the PPL 100 according to external environments, it is necessary to change a bias current applied to the charge pump. For example, in response to the bias current applied to the charge pump, a loop gain of a PPL may vary.

However, according to a change in level of the bias current applied to the charge pump, transistors included in the charge pump may malfunction.

In the embodiment, the charge pump 120 may control an amount of currents applied to transistors according to a control signal applied from the controller 130. For example, the charge pump 120 may control the amount of currents by dropping a voltage using a plurality of resistors or by changing a size of a transistor, which will be described in detail with reference to FIGS. 3 and 5.

Figure 2:
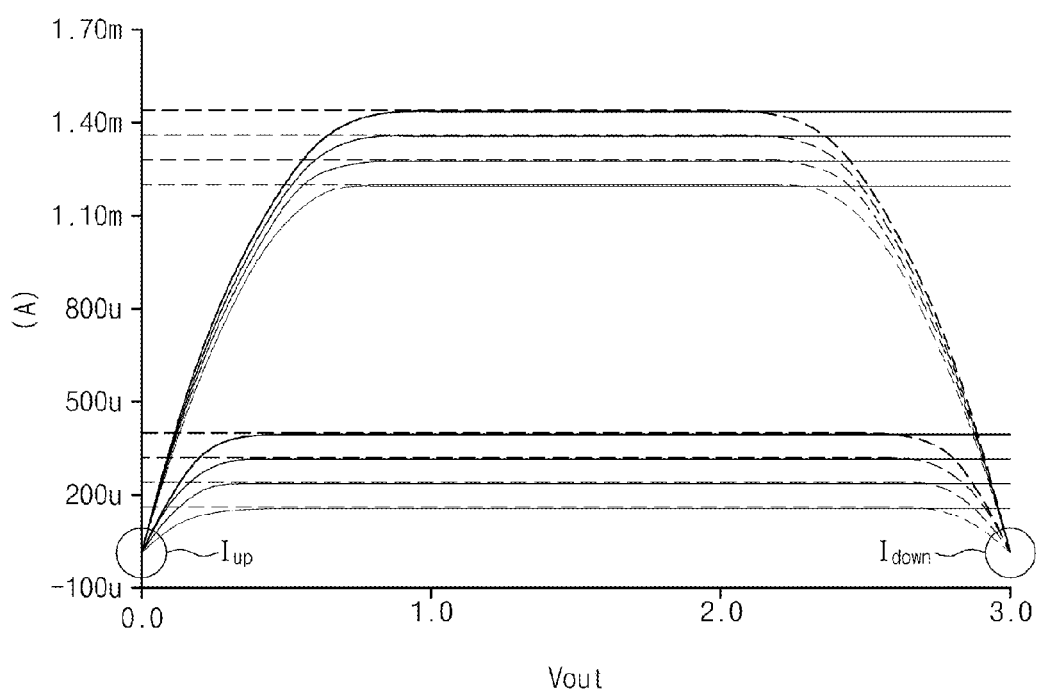
FIG. 2 is a graph illustrating outputting properties of a general charge pump.

FIG. 2 is a graph illustrating general outputting properties of the charge pump of FIG. 1. An X axis indicates an output node voltage Vout of the charge pump 120. A Y axis indicates output properties according to up and down currents Iup and Idown of the charge pump.

Referring to FIG. 2, for example, the bias current applied to the charge pump may be determined to be 25 uA, 50 uA, 75 uA, 100 uA, 325 uA, 350 uA, 375 uA, and 400 uA. Also, up and down current outputting properties of the charge pump are assumed to be mirrored in the ratio of 1:4 based on the bias current described above. Accordingly, the up and down currents Iup and Idown have outputting properties such as 100 uA, 200 uA, 300 uA, 400 uA, 1300 uA, 1400 uA, 1500 uA, and 1600 uA.

Generally, when a current gain of the output end of the charge pump is suitable, the up and down currents Iup and Idown have the same matching value. That is, as a section, in which the up and down currents Iup and Idown have the same matching value, more increases, an output voltage range of the charge pump may be improved. Accordingly, an input voltage range of the voltage control oscillator may be improved.

However, referring to FIG. 2, it may be known that when a bias current IB is set to be high, a matching part between the up and down currents Iup and Idown may be reduced, thereby reducing the input voltage range of the voltage control oscillator.

Figure 3:
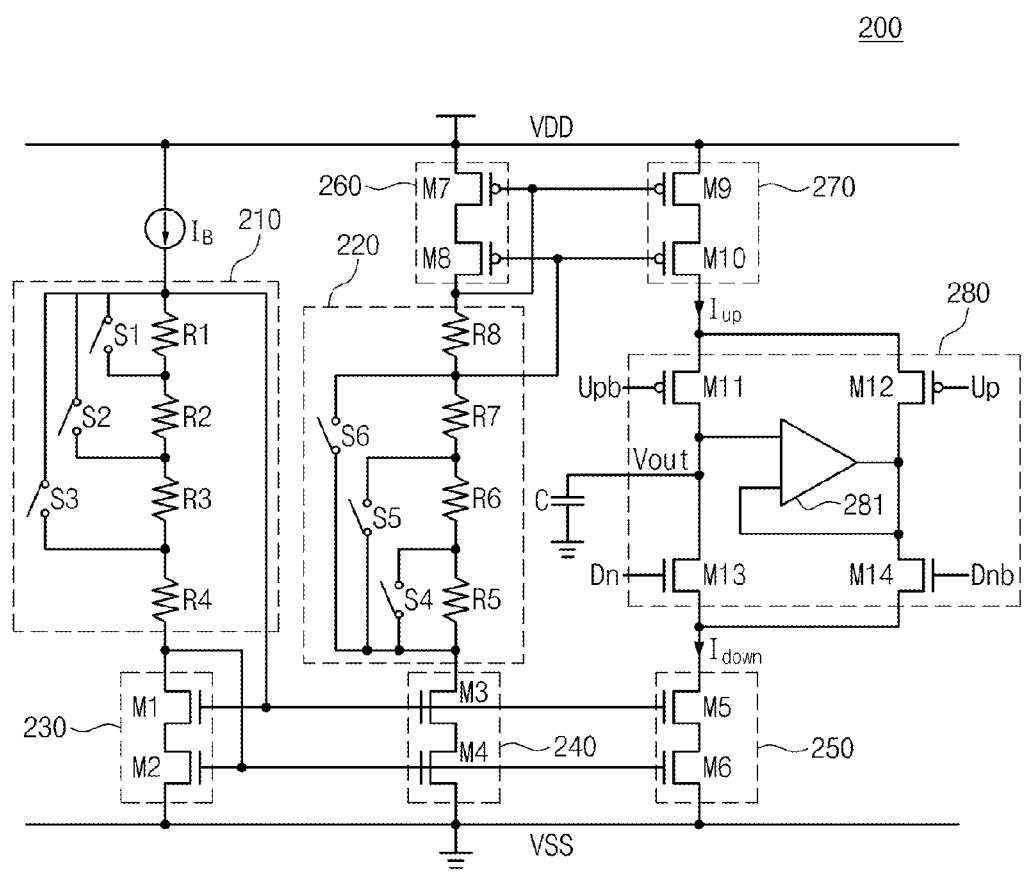
FIG. 3 is a circuit diagram of a charge pump according to an embodiment of the present invention.

FIG. 3 is a circuit diagram of a charge pump 200 according to an embodiment of the present invention. Referring to FIG. 3, the charge pump 200 includes a bias current IB, first and second voltage controllers 210 and 220, first to fifth mirror units 230, 240, 250, 260, and 270, and an output unit 280. In the embodiment, transistors included in the first to third mirror units 230, 240, and 250 may be N-channel metal oxide semiconductor (NMOS) transistors and transistors included in the fourth and fifth mirror units 260 and 270 may be P-channel metal oxide semiconductor (PMOS) transistors.

The bias current IB may be various values in order to allow a gain of the PPL 100 to vary. For example, as the value of the bias current IB is set to be higher, a level of a current outputted from the output unit 280 becomes higher. The bias current IB may vary with one of an internal voltage source and an external voltage source.

The first voltage controller 210 includes first to third switches S1, S2, and S3 and first to fourth R1, R2, R3, and R4. However, the numbers of the resistors and switches included in the first voltage controller 210 are not limited thereto.

The first resistor R1 is located between a bias current terminal and the second resistor R2, and the second, third, and fourth resistors R2, R3, and R4 are sequentially connected to the first resistor R1 in series. Also, the first switch S1 is located between the bias current terminal and the first and second resistors R1 and R2. The second switch S2 is located between the bias current terminal and the second and third resistors R2 and R3. The third switch S3 is located between the bias current terminal and the third and fourth resistors R3 and R4.

The first mirror unit 230 includes first and second transistors M1 and M2. For example, the first and second transistors M1 and M2 may be cascode transistors.

A drain of the first transistor M1 is connected to the fourth resistor R4, a gate thereof is connected to the bias current terminal, and a source thereof connected to a drain of the second transistor M2, respectively. A source of the second transistor M2 is connected to a ground, and a gate thereof is connected to the fourth resistor R4.

Also, in the embodiment, the first voltage controller 210 includes the first to fourth resistors R1, R2, R3, and R4, thereby allowing the bias current IB to be set to be four stages according to external control. That is, according to the bias current IB set under the external control, a method of dropping a voltage using resistors may be controlled. As the bias current IB is set to be the four stages, first to fourth stages of a current level may be outputted from the charge pump 200. For example, in the bias current and the level outputted from the charge pump 200, a current level according to the first stage may be greatest and a current level may become smaller in an order of the second stage, the third stage, and the fourth stage.

In case of a general charge pump, since the first voltage controller 210 is configured to be a single resistor, an amount of currents applied to the first current mirror unit is not controlled according to a set value of the bias current IB. For example, when the bias current IB is set to be higher, a voltage level applied to a gate of a second transistor M2 becomes lower than a threshold voltage Vth and the second transistor M2 does not operate. In detail, a gate voltage of the second transistor M2 may be an output end voltage of the first voltage controller 210. That is, the gate voltage of the second transistor M2 may be obtained by subtracting a product of the bias current IB and the resistors from an input end voltage level of the first voltage controller 210.

The first voltage controller 210 may control an output end voltage level through the first to third switches S1, S2, and S3 operating according to the switching control signal. That is, a voltage applied to the gate of the second transistor M2 may be controlled. In detail, based on the bias current IB set to have the four stages, an operation of the first voltage controller 210 will be described.

In the embodiment, when the value of the bias current IB is set to be the first stage having the greatest value, only the third switch S3 may be turned on. Herein, a greatest current level according to the first stage may be outputted from the charge pump 200.

In the embodiment, when the value of the bias current IB is set to be the second stage, only the second switch S2 may be turned on. Herein, a current level according to the second stage may be outputted from the charge pump 200.

In the embodiment, when the value of the bias current IB is set to be the third stage, only the first switch S1 may be turned on. Herein, a current level according to the third stage may be outputted from the charge pump 200.

In the embodiment, when the value of the bias current IB is set to be the fourth stage, all the first to third switches S1, S2, and S3 may be turned off. Herein, a smallest current level according to the fourth stage may be outputted from the charge pump 200.

As described above, the first voltage controller 210, in response to the set value of the bias current IB, may control the voltage level applied to the output end. Also, the first to third switches S1, S2, and S3 may operate in response to the switching control signal applied form the controller 130, respectively.

The second voltage controller 220 may be configured identical to the first voltage controller 210. The second and third mirror units 240 and 250 have a structure mirroring the first mirror unit 230, thereby operating according to the same voltage properties as the first mirror unit 230. Based on this, the fourth mirror unit 260 may applied the same value as the bias current IB to the second voltage controller 220. Accordingly, according to the method of dropping the voltage of the second voltage controller 220, an output end voltage of the second voltage controller 220 may be identical to the output end voltage level of the first voltage controller 210.

In detail, the second voltage controller 220 includes fourth to sixth switches S4, S5, and S6 and fifth to eighth resistors R5, R6, R7, and R8. However, the numbers of the resistors and switches included in the second voltage controller 220 are not limited thereto.

The fifth resistor R5 is located between the second mirror unit 240 and the sixth resistor R6, and the sixth, seventh, and eighth resistors R6, R7, and R8 are sequentially connected to the fifth resistor R5 in series. Also, the fourth switch S4 is located between the second mirror unit 240 and the fifth and sixth resistors R5 and R6. The fifth switch S5 is located between the second mirror unit 240 and the sixth and seventh resistors R6 and R7. The sixth switch S6 is located between the second mirror unit 240 and the seventh and eighth resistors R7 and R8.

In detail, similar to the first voltage controller 210, when the value of the bias current IB is set to be the first stage having the greatest value, the sixth switch S6 may be turned on. Herein, the sixth switch S6 may operate similarly to the third switch S3.

When the value of the bias current IB is set to be the second stage, the fifth switch S5 may be turned on. Herein, the fifth switch S5 may operate similarly to the second switch S2.

When the value of the bias current IB is set to be the second stage, the fourth switch S4 may be turned on. Herein, the fourth switch S4 may operate similarly to the first switch S1.

Lastly, when the value of the bias current IB is set to be the fourth stage, all the fourth to sixth switches S4, S5, and S6 may be turned off. Herein, all the first to third switches S1, S2, and S3 may be turned off.

In the embodiment, a ratio among the first to fourth resistors R1, R2, R3, and R4 may be formed to be 1:1:1:1 but is not limited thereto and may be variously formed. Also, a ratio among the fifth to eighth resistors R5, R6, R7, and R8 may be formed to be 1:1:1:1 but is not limited thereto and may be variously formed. Also, the fourth to sixth switches S4, S5, and S6 may operate in response to the switching control signal applied from the controller 130, respectively.

As described above, the second voltage controller 220, in response to a current level applied from the fourth mirror unit 260, may control a voltage level applied to the output end.

The third mirror unit 250 may include fifth and sixth transistors M5 and M6. The third mirror unit 250 and the second mirror unit 240 may have structures mirroring each other. The third mirror unit 250 is located between the output unit 280 and a ground and may discharge a voltage of a capacitor C connected to the output unit 280. The capacitor C may be included in the loop filter 140 (refer to FIG. 1).

The fourth mirror unit 260 includes seventh and eighth transistors M7 and M8. The fourth mirror unit 260 is located between a power supply and the second voltage controller 220 and applies a current level corresponding to the bias current IB to the second voltage controller 220.

The fifth mirror unit 270 includes ninth and tenth transistors M9 and M10. The fifth mirror unit 270 is located between the power supply and the output unit 280. The fifth mirror unit 270 and the fourth mirror unit 260 have structures mirroring each other. The fifth mirror unit 270 may charge the capacitor C connected to the output unit 280 with a voltage.

Also, in the embodiment, sizes of the transistors included in the third and fifth mirror units 250 and 270 may be greater four times than sizes of the transistors included in the first, second, and fourth mirror units 230, 240, and 260. Accordingly, the charge pump 200, in response to the bias current IB set according to external control, may output a current level more increasing four times than the bias current IB. However, the sizes of the transistors included in the third and fifth mirror units 250 and 270 are not limited thereto and may be variously provided.

The output unit 280 includes eleventh to fourteenth transistors M11, M12, M13, and M14 and an amplifier 281. In the embodiment, the eleventh and twelfth transistors M11 and M12 may be PMOS transistors and the thirteenth and fourteenth transistors M13 and M14 may be NMOS transistors. The output unit 280, in response to an up current Iup applied from the fifth mirror unit 270 and a down current Idown discharged through the third mirror unit 250, charges or discharges the capacitor C included in the loop filter 140 with a voltage.

Also, in the embodiment, the eleventh and twelfth transistors M11 and M12 and the thirteenth and fourteenth transistors M13 and M14 may operate complementarily to one another, respectively. Also, first and second control signals Upb and Up and third and fourth control signals Dn and Dnb may be clock signals having phases opposite to one another, respectively.

When the capacitor C of the loop filter 140 is charged with the voltage, the eleventh transistor M11 is turned on in response to a low level of the first control signal Upb and charges the capacitor C with the voltage based on the up current Iup applied from the fifth mirror unit 270. Herein, the twelfth transistor M12 is turned off in response to a high level of the second control signal Up. Also, the thirteenth transistor M13 is turned off in response to a low level of the third control signal Dn. Similarly, the fourteenth transistor M14 is turned on in response to a high level of the fourth control signal Dnb. That is, the output unit 280 charges the capacitor C with the voltage but does not discharge.

When the capacitor C of the loop filter 140 is charged or discharged with the voltage, the eleventh transistor M11 is turned on in response to the low level of the first control signal Upb and the twelfth transistor M12 is turned off in response to the high level of the second control signal Up. Herein, the thirteenth transistor M13 is turned on in response to a high level of the third control signal Dn. Accordingly, the output unit 280 may discharge the voltage of the capacitor C through the third mirror unit 250.

For example, when the capacitor C is charged or discharged with the voltage according to the up and down currents Iup and Idown, the capacitor C may maintain the same charge when the up and down currents Iup and Idown have the same current level. That is, the up and down currents Iup and Idown have the same matching value, thereby improving an output voltage range of the charge pump 200. The first and second voltage controllers 210 and 220 uniformly control the voltage level of the output end according to the bias current IB, thereby controlling the matching values of the up and down currents Iup and Idown to be uniform.

When the voltage of the capacitor C of the loop filter 140 is discharged, the eleventh transistor M11 is turned off in response to a high level of the first control signal Upb. Herein, the twelfth transistor M12 is turned on in response to a low level of the second control signal Up. The up current Iup applied from the fifth mirror unit 270 is discharged through the twelfth transistor M12.

Also, the thirteenth transistor M13 is turned on in response to the high level of the third control signal Dn. When the thirteenth transistor M13 is turned on, charges of the capacitor C, that is, the down current Idown may be discharged through the third mirror unit 250. The fourteenth transistor M14 is turned off in response to a low level of the fourth control signal Dnb.

The amplifier 281 compares voltage values of two input terminals and allows the input terminals to have the same value within a certain range.

As described above, the charge pump 200 may increase current matching properties of the up and down currents Iup and Idown based on the method of dropping the voltages of the first and second voltage controllers 210 and 220 according to a set value of the bias current IB.

Figure 4:
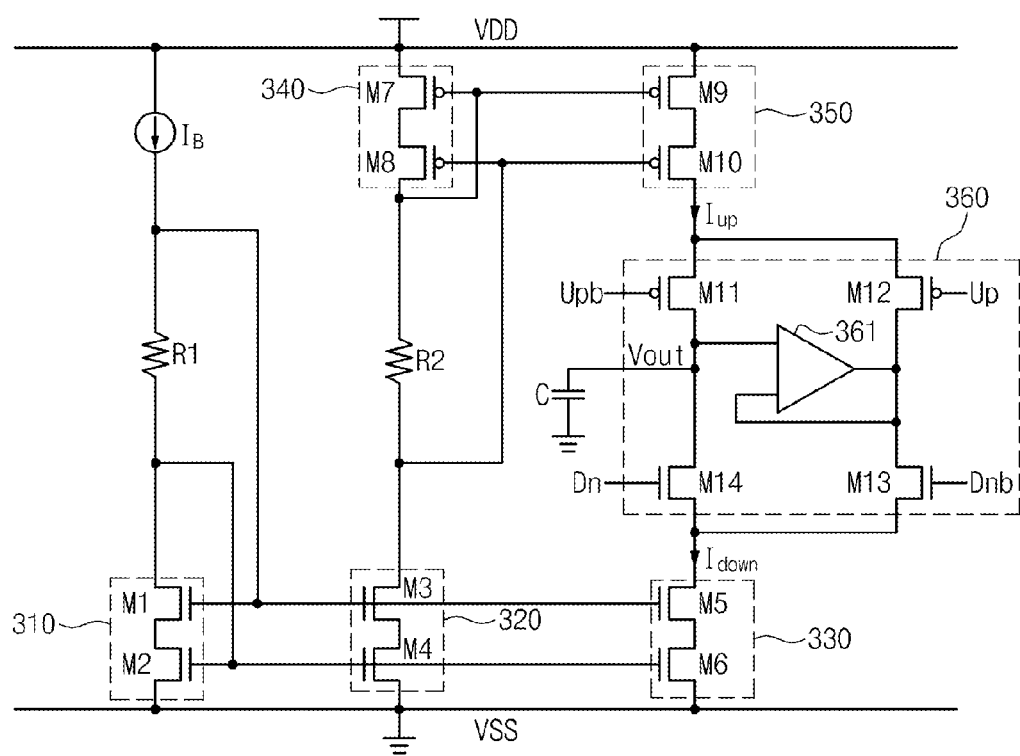
FIG. 4 is a circuit diagram illustrating a charge pump according to another embodiment of the present invention.

FIG. 4 is a circuit diagram illustrating a charge pump 300 according to another embodiment of the present invention. Referring to FIG. 4, the charge pump 300 includes a bias current IB, first and second resistors R1 and R2, first to fifth mirror units 310, 320, 330, 340, and 350, and an output unit 360. Overall operations of the charge pump 300 may be identical to those of the charge pump 200 of FIG. 3.

However, the charge pump 300, compared with the charge pump 200 of FIG. 3, may apply the same voltage to the respective mirror units based on operations of a plurality of transistors, instead of the method of dropping a voltage by using a plurality of resistors.

The first to third mirror units 310, 320, and 330 may have structures mirroring one another and may include first and second transistor parts including a plurality of NMOS transistors, respectively. The fourth and fifth mirror units 340 and 350 may have structures mirroring each other and may include first and second transistor parts including a plurality of PMOS transistors, respectively. Also, the first and second transistor parts of the respective mirror units may have cascode structures.

In the embodiment, sizes of the first and second transistor parts included in the third and fifth mirror units 330 and 350 may be greater four times than sizes of the first and second transistor parts included in the first, second, and fourth mirror units 310, 320, and 340. That is, in response to the bias current IB set under external control, the fourth and fifth mirror units 340 and 350 may apply to and receive a current greater four times than the bias current IB to the output unit 360.

In the embodiment, the respective transistor parts include a plurality of transistors and a plurality of switches and the plurality of switches perform on and off operations, respectively, in response to an external control signal. That is, according to a set value of the bias current IB, the operations of the plurality of switches may be controlled. The external control signal may be applied from the controller 130.

Figure 5:
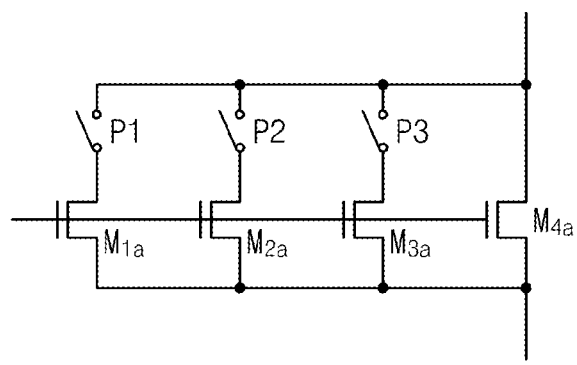
FIGS. 5 and 6 are circuit diagrams of an N-channel metal oxide semiconductor (NMOS) transistor part and a P-channel metal oxide semiconductor (PMOS) transistor part of the charge pump of FIG. 4, respectively.
Figure 6:
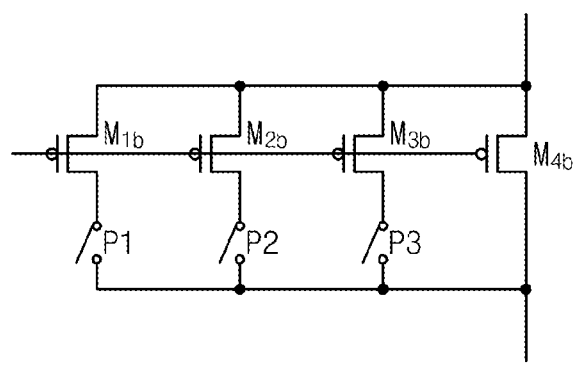

FIGS. 5 and 6 are circuit diagrams of examples of the NMOS and PMOS transistor parts of the charge pump 300, respectively. A transistor part of FIG. 5 may be any one of the transistor parts included in the first to third mirror units 310, 320, and 330. In the embodiment, the transistor parts included in the first to third mirror units 310, 320, and 330 may have the same structure. Also, a transistor part of FIG. 6 may be any one of the transistor parts included in the fourth and fifth mirror units 340 and 350. Similarly, in the embodiment, the transistor parts included in the fourth and fifth mirror units 340 and 350 may have the same structure.

Referring to FIGS. 5 and 6, in the embodiment, the respective transistor parts included in the first to fifth mirror units 310, 320, 330, 340, and 350 include first to fourth NMOS transistors M1a, M2a, M3a, and M4a. The first to fourth NMOS transistors M1a, M2a, M3a, and M4a may operate based on first to third switches P1, P2, and P3.

In detail, the first NMOS transistor M1a, the second NMOS transistor M2a, and the third NMOS transistor M3a may output currents to an output terminal in response to the first switch P1, the second switch P2, and the third switch P3, respectively. The fourth NMOS transistor M4a may output a current to the output terminal without a structure connected to a switch.

The respective transistor parts included in the fourth and fifth mirror units 340 and 350 include first to fourth PMOS transistors M1b, M2b, M3b, and M4b. Similarly, the first to fourth PMOS transistors M1b, M2b, M3b, and M4b may operate based on first to third switches P1, P2, and P3.

In detail, the first PMOS transistor M1b, the second PMOS transistor M2b, and the third PMOS transistor M3b may output currents to an output terminal in response to the first switch P1, the second switch P2, and the third switch P3, respectively. The fourth PMOS transistor M4b may output a current to the output terminal without a structure connected to a switch.

In the embodiment, the first to third switches P1, P2, and P3 of the respective transistor parts included in the first to fifth mirror units 310, 320, 330, 340, and 350 may uniformly operate in response to a control signal applied to the controller 130. For example, when the bias current IB is set to be greatest, all the first to third switches P1, P2, and P3 included in the respective transistor parts may be turned on.

On the contrary, when the bias current IB is set to be smallest, all the first to third switches P1, P2, and P3 may be turned off. That is, currents may be outputted outwards only through the fourth NMOS transistor M4a and the fourth PMOS transistor M4b.

Throughout the embodiment, the number of the plurality of transistors included in the respective transistor parts has been described 4 but is not limited thereto. Also, the number of the switches included in the respective transistor parts has been described 3 but is not limited thereto. That is, according to a variation in level of the bias current IB, the numbers of the transistors and switches included in the respective transistor parts may be controlled.

Also, in the embodiment, a ratio among sizes of the first to fourth PMOS and NMOS transistors may be 1:1:1:1. However, the ratio among the sizes of the transistors is not limited thereto but may be variously provided.

As described above, the charge pump 300 may control the operations of the first to third switches P1, P2, and P3 according to the set value of the bias current IB. That is, according to voltage values of the plurality of transistors according to controlling of the first to third switches P1, P2, and P3, voltage levels of input and output ends of the first and second resistors R1 and R2 may be controlled.

Figure 7:
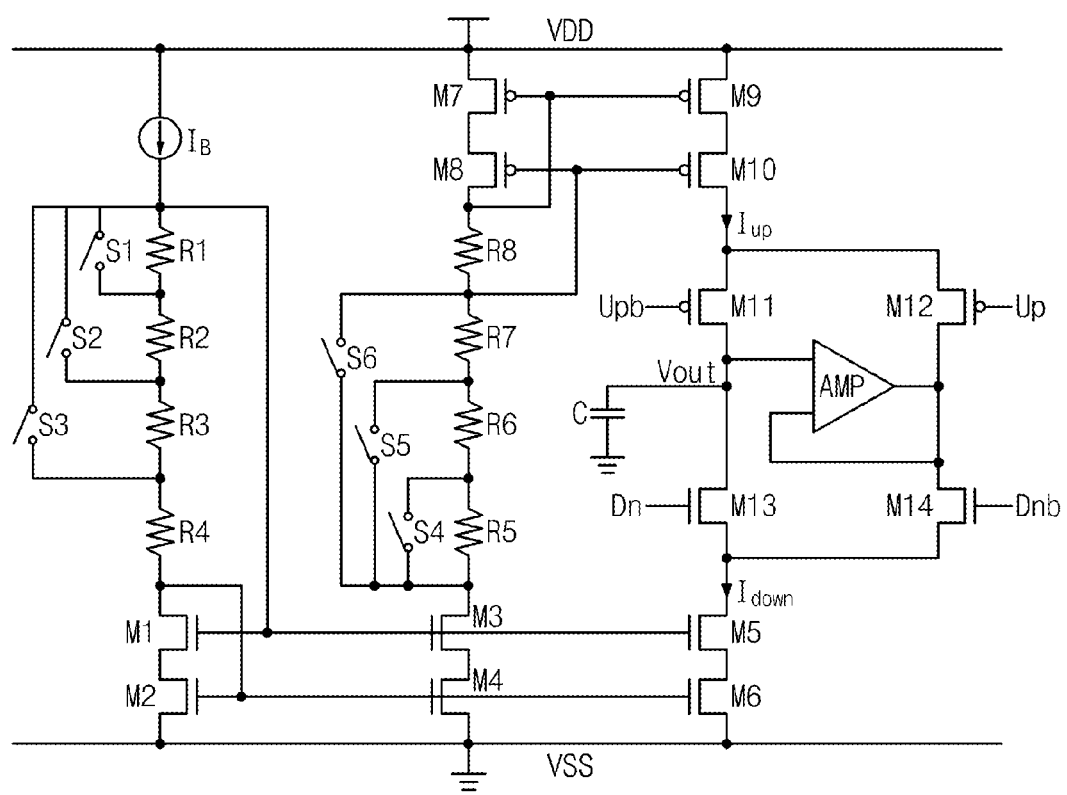
FIG. 7 is a circuit diagram illustrating a charge pump according to still another embodiment of the present invention.

FIG. 7 is a circuit diagram illustrating a charge pump 400 according to still another embodiment of the present invention. Referring to FIG. 7, the charge pump 400 uses a method obtained by combining the method of controlling a current by controlling a resistance value with the method of controlling a current by controlling a size of a transistor shown in FIGS. 3 and 4, respectively. Accordingly, the charge pump 400 may more increase a value of matching current gains of the up and down currents Iup and Idown than the charge pumps 200 and 300 shown in FIGS. 3 and 4.

According to the embodiments, current matching properties of a charge pump circuit improve, thereby increasing an output voltage range of a charge pump. Also, according to controlling current properties of the charge pump, outputting properties of the PPL may improve.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A charge pump circuit having a current mirror structure, comprising:
    a first voltage controller comprising a plurality of first resistors and a plurality of first switches, and in response to a switching control signal corresponding to a bias current, driving the plurality of first switches to allow a current path passing through the plurality of first resistors to bypass, thereby controlling a voltage level of an output end;
    a second voltage controller comprising a plurality of second resistors and a plurality of second switches, and in response to the switching control signal, driving the plurality of second switches to allow a current path passing through the plurality of second resistors to bypass, thereby controlling a voltage level of an output end to correspond to the voltage of the output end of the first voltage controller; and
    an output unit charging or discharging an external capacitor with a voltage, based on the voltage level of the output end of the first voltage controller.

2. The charge pump circuit of claim 1, further comprising:
    a first mirror unit located between the first voltage controller and a ground terminal;
    a second mirror unit located between the second voltage controller and the ground terminal;
    a third mirror unit located between the output unit and the ground terminal;
    a fourth mirror unit located between a power supply terminal and the second voltage controller; and
    a fifth mirror unit located between the power supply terminal and the output unit,
    wherein the first to fifth mirror units operate based on the voltage level of the output end of the first voltage controller.

3. The charge pump circuit of claim 2, wherein the first to fifth mirror units comprise first and second transistors, respectively, and
    wherein the first and second transistors of the third and fifth mirror units are manufactured to be larger than the first and second transistors of the first, second, and fourth mirror units with certain rates.

4. The charge pump circuit of claim 3, wherein the first and second transistors have a cascode structure.

5. The charge pump circuit of claim 3, wherein the first and second transistors of the first to third mirror units are N-channel metal oxide semiconductor (NMOS) transistors.

6. The charge pump circuit of claim 3, wherein the first and second transistors of the fourth and fifth mirror units are P-channel metal oxide semiconductor (PMOS) transistors.

7. The charge pump circuit of claim 2, wherein the first to fifth mirror units comprise first and second transistor parts, respectively, and
    wherein the first and second transistor parts of the respective mirror units comprise a plurality of transistors, respectively.

8. The charge pump circuit of claim 7, wherein the output unit comprises first to fourth output transistor parts, and
   wherein the first to fourth output transistor parts comprise a plurality of transistors, respectively.

9. The charge pump circuit of claim 8, wherein the first and second transistor parts of the respective mirror units and the first to fourth output transistor parts of the output unit comprise a plurality of switches, respectively, and
   wherein the plurality of switches of the respective mirror units and the output unit uniformly operate according to a set value of the bias current.

10. The charge pump circuit of claim 1, wherein the first voltage controller, when a level of the bias current is set to be great, operates to allow the voltage level of the output end to be small by dropping a voltage using the plurality of first resistors, and
   wherein the first voltage controller, when the level of the bias current is set to be small, operates to allow the voltage level of the output end to be great by dropping the voltage using the first resistors.

11. A phase-locked loop (PPL) comprising:
   a phase detector generating up and down signals based on differences in phase and frequency of a reference frequency and an oscillating frequency;
   a charge pump receiving a bias current and outputting up and down currents based on the bias current in response to the up and down signals;
   a loop filter generating a voltage in response to an output of the up and down currents; and
   a voltage control oscillator outputting the oscillating frequency in response to an output voltage of the loop filter,
   wherein the charge pump comprises a plurality of resistors and a plurality of switches, and in response to a switching control signal corresponding to the bias current, drives the plurality of switches to allow a current path passing through the plurality of resistors to bypass, thereby controlling a voltage level of an output end of the charge pump.

12. The PPL of claim 11, further comprising a controller generating the switching control signal.

* * * * *